United States Patent
Stoner et al.

(10) Patent No.: US 7,142,256 B2
(45) Date of Patent: Nov. 28, 2006

(54) TELEVISION CONTROL DEVICE

(75) Inventors: Mark Peter Stoner, Dassel, MN (US); Nicholas Michael Beedle, Buffalo, MN (US); John Heinsch, Lester Prairie, MN (US)

(73) Assignee: Crest Health Care, Dassel, MN (US)

( * ) Notice: Subject to any disclaimer, the term of this patent is extended or adjusted under 35 U.S.C. 154(b) by 706 days.

(21) Appl. No.: 10/230,172

(22) Filed: Aug. 28, 2002

(65) Prior Publication Data

US 2003/0043302 A1   Mar. 6, 2003

Related U.S. Application Data

(60) Provisional application No. 60/315,448, filed on Aug. 28, 2001.

(51) Int. Cl.
*H04N 5/44* (2006.01)
*H04N 7/16* (2006.01)

(52) U.S. Cl. .......... 348/734; 348/730; 348/14.05; 340/825.22; 340/286.07

(58) Field of Classification Search .......... 348/734, 348/730, 733, 725, 14.05, 705, 706; 340/825.22, 340/825.24, 825.25, 825.27, 825.69, 825.72, 340/286.07; 725/78, 83, 84; 381/80, 81, 381/85
See application file for complete search history.

(56) References Cited

U.S. PATENT DOCUMENTS

| | | | |
|---|---|---|---|
| 4,680,790 A * | 7/1987 | Packard et al. .......... 379/432 |
| 4,979,217 A * | 12/1990 | Shipley .......... 381/81 |
| 5,113,481 A * | 5/1992 | Smallwood et al. .......... 704/271 |
| 5,495,301 A | 2/1996 | Mudra |
| 5,502,513 A * | 3/1996 | Mudra .......... 348/734 |
| 5,523,781 A * | 6/1996 | Brusaw .......... 725/151 |
| 5,838,223 A * | 11/1998 | Gallant et al. .......... 340/286.07 |
| 6,005,486 A * | 12/1999 | Fridley et al. .......... 340/825.22 |
| 6,008,736 A | 12/1999 | Palm et al. |
| 6,118,490 A * | 9/2000 | Moore et al. .......... 348/473 |
| 6,366,328 B1 * | 4/2002 | Vanderpohl et al. .......... 348/734 |
| 6,532,592 B1 * | 3/2003 | Shintani et al. .......... 725/141 |
| 6,593,972 B1 * | 7/2003 | Johnson, Jr. .......... 348/473 |
| 6,661,471 B1 * | 12/2003 | Vornsand .......... 348/731 |
| 6,795,130 B1 * | 9/2004 | Shibamiya .......... 348/734 |
| 6,882,352 B1 * | 4/2005 | Terakado et al. .......... 715/717 |
| 2002/0053086 A1 * | 5/2002 | Vanderpohl et al. .......... 725/78 |
| 2002/0151990 A1 * | 10/2002 | Ulrich et al. .......... 700/65 |

FOREIGN PATENT DOCUMENTS

| DE | 0288196 A2 | 10/1988 |
|---|---|---|
| DE | 4440174 A1 | 5/1996 |

* cited by examiner

*Primary Examiner*—David Ometz
*Assistant Examiner*—Jean W. Désir
(74) *Attorney, Agent, or Firm*—Dorsey & Whitney LLP

(57) ABSTRACT

A system and apparatus for controlling a television. Various embodiments of the apparatus have various components providing compatibility with most brands and types of televisions.

17 Claims, 3 Drawing Sheets

TELEVISION CONTROL DEVICE

CROSS-REFERENCE TO RELATED APPLICATION

This application claims priority from U.S. Provisional Application No. 60/315,448, entitled "Control Device for a Hospital Television," dated Aug. 28, 2001, the contents of which are hereby incorporated by reference in their entirety.

FIELD OF THE INVENTION

The present invention relates to a device for controlling one or more televisions.

BACKGROUND OF THE INVENTION

Television receivers in the individual rooms of healthcare facilities such as hospitals, hospices, nursing homes, and other healthcare concerns have become data-capable. The data-capability of each television provides interactive functionality for the pendant control, or pillow speaker, which a user typically operates to control the television. A pillow speaker is a data input device for controlling a television receiver. Upon input from the user, the pillow speaker typically generates an encoded signal that is transmitted to the television to trigger a function such as powering on the television or switching channels.

A pillow speaker is typically hardwired to a television using, for example, a three wire interface through a manufacturer-supplied input receptacle, located on the back of the set. The three wire interface typically consists of (1) the receiving line on which the pillow speaker transmits a control code ("the DATA line"), (2) the line on which the television sends the audio signal to the speaker located on the pillow speaker ("the AUDIO line"), and (3) the line which the DATA and AUDIO lines are referenced to electrically ("the COM line").

In some pillow speakers, the audio is routed from the television over the AUDIO line to the pillow speaker at a fixed, maximum level. To achieve a change in speaker volume, the user physically manipulates a mechanical potentiometer such as a potentiometer wiper or varying tap provided on the pillow speaker. Enhanced or digital pillow speakers may send data codes to the television causing the television to raise or lower the audio level on the AUDIO line.

Most pillow speaker are either enhanced (digital) or non-enhanced (analog). The difference between enhanced and non-enhanced pillow speakers is the complexity of the code sent over the DATA line and hence the functionality of the pillow speaker.

Non-enhanced pillow speakers typically have only three control features: incremental channel control, volume control, and power on/off. The channel control and power on/off functions are implemented with a single switch that is normally open. When there is no power to the television, a button on the pillow speaker can be pressed, causing the switch to close and the television to power up. Each subsequent switch closure will cause an incremental change in the channel being received by the television until the "power off" channel is reached, at which point the television will power down.

An enhanced pillow speaker transmits a mid-frequency modulated signal or code to the data-capable television receiver over the DATA line. The code is specific to a desired television function and may allow for more interactivity.

A pillow speaker is typically manufactured to specifications specifically compatible with the television to which the pillow speaker is connected. These specifications vary across types and brands of television/pillow speaker combinations. Upon input from the user, a typical enhanced or digital pillow speaker is capable of generating a brand-specific encoded signal, which the appropriate television is capable of interpreting and thereafter performing the responsive function. The control codes are typically unique to each brand or type of television. Further, a typical pillow speaker is designed to be specifically compatible with the polarity and magnitude of the steady state bias measured between the DATA and COM lines for a particular brand of television. These voltage polarities and voltage magnitudes also vary significantly across brands of televisions. Further, given the polarity variability, the ability to derive power solely from the television is manufacturer-specific as well.

One problem with pillow speakers currently on the market is the lack of interchangeability. Given the specific and varied requirements across television manufacturers related to voltage polarities, voltage magnitudes, and control codes, consumers have been forced to purchase only those pillow speakers designed specifically for use with available television units.

Another problem relates to volume control. The mechanical potentiometer required to adjust the volume on a typical pillow speaker requires an invasive opening in the pillow speaker housing. This opening is typically the primary entry point for damaging moisture, contaminants, and gases.

Thus there exists a need for an improved pillow speaker.

BRIEF SUMMARY OF THE INVENTION

The present invention, in one embodiment, is an apparatus for controlling a television. The apparatus includes a housing electrically coupled to a television, a power supply that derives power from electrical power from the television, and a microprocessor that transmits encoded signals to the television. The power supply can receive any polarity of the electrical current from the television and outputs an appropriate polarity of electrical power to the apparatus. In another embodiment, the apparatus includes a housing electrically coupled to a television, a microprocessor that transmits encoded signals to the television, and a bilateral switch that allows the microprocessor to transmit encoded signals to the television by making compatible any voltage polarity of the electrical current from the television.

The present invention, in another embodiment, includes a housing coupled to a television, a sensor circuit that senses information generated by the television, and a microprocessor that receives the information from the sensor circuit, identifies the television based on the information, and transmits only compatible encoded signals to the television.

In a further embodiment, the present invention is an apparatus including a housing coupled to a television, a user interface that allows transmission of signals to control volume, and a volume control circuit having a plurality of audio output channels that are selectively enabled by the signals from the user interface.

In another embodiment, the present invention is a communication system. The communication system includes a central station, a nurse call system, a remote apparatus, and a television. The nurse call system sends signals to the central station and receives signals from the central station. The remote apparatus includes a power supply that derives power for the remote apparatus from incoming electrical current, receives any polarity from the electrical current, and outputs an appropriate polarity of the electrical power to the apparatus, and a microprocessor that transmits encoded signals to the central station. The television transmits electrical current to the remote apparatus and receives encoded signals from the remote apparatus through the nurse call system.

While multiple embodiments are disclosed, still other embodiments of the present invention will become apparent to those skilled in the art from the following detailed description. As will be apparent, the invention is capable of modifications in various obvious aspects, all without departing from the spirit and scope of the present invention. Accordingly, the drawings and detailed description are to be regarded as illustrative in nature and not restrictive.

DETAILED DESCRIPTION

Figure 1:
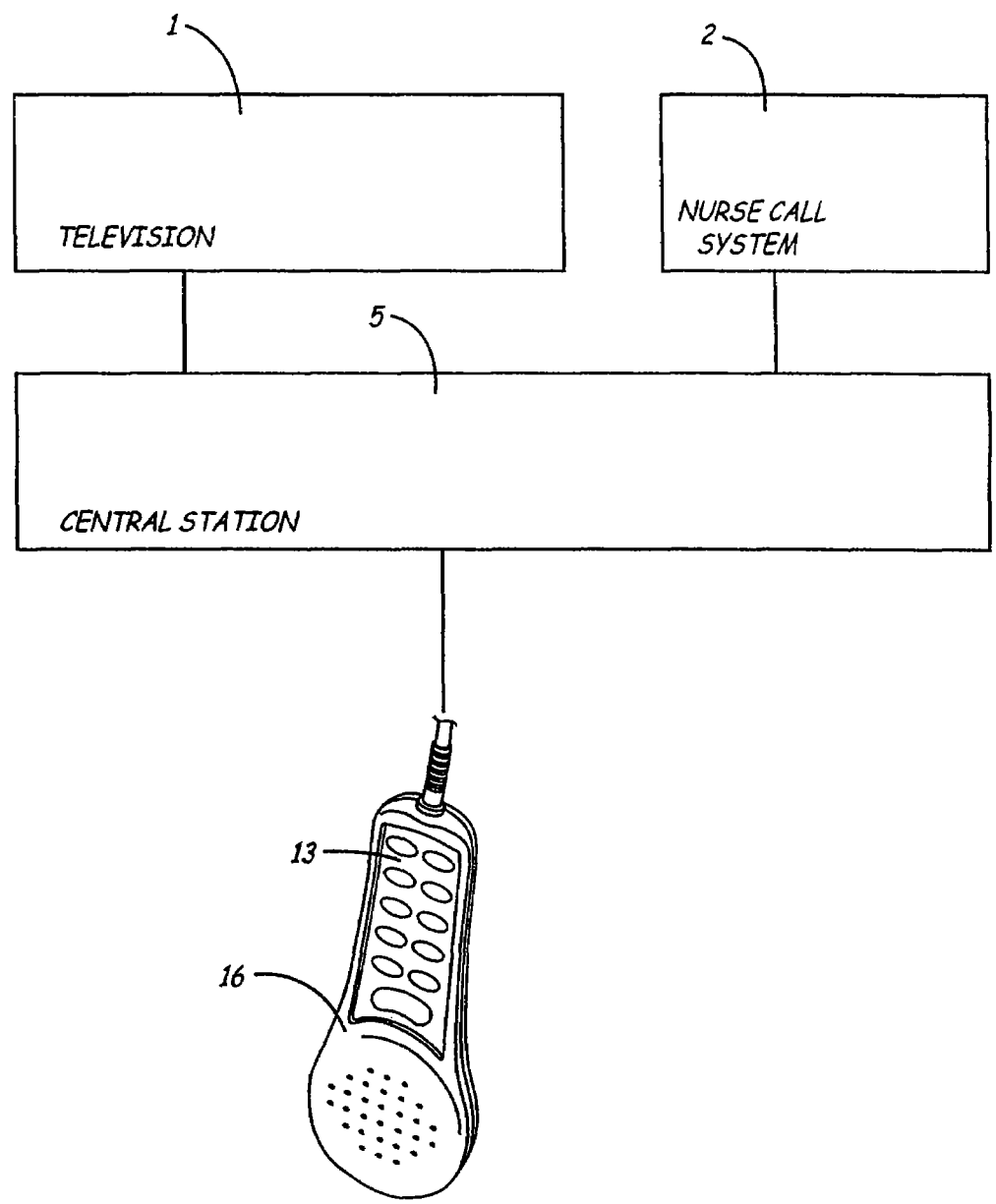
FIG. 1 is a block diagram of a television control system, according to one embodiment of the present invention.

FIG. 1 shows one embodiment of a television control system in which a television 1 is connected to a pillow speaker 16. That is, the television 1 is connected to a central station 5, which in turn is connected to the pillow speaker 16. Alternatively, the television 1 may be connected directly to the pillow speaker 16. A nurse call system 2 is also connected to the central station 5. Power is provided to the pillow speaker 16 by the television 1. Since the pillow speaker 16 is compatible with any television 1 produced by any major manufacturer, the television 1 can be of any type or brand. Alternatively, the pillow speaker 16 can be connected to and operate a plurality of televisions (not shown) of different types and brands.

The communication system of FIG. 1 allows communications from the nurse call system 2 to the pillow speaker 16. For example, the pillow speaker 16 may receive intercom audio or pages from the nurse call system 2. Thus, the connection to the pillow speaker 16 from the central station 5 may include wiring from the television 1 and wiring from the nurse call system 2.

Figure 2:
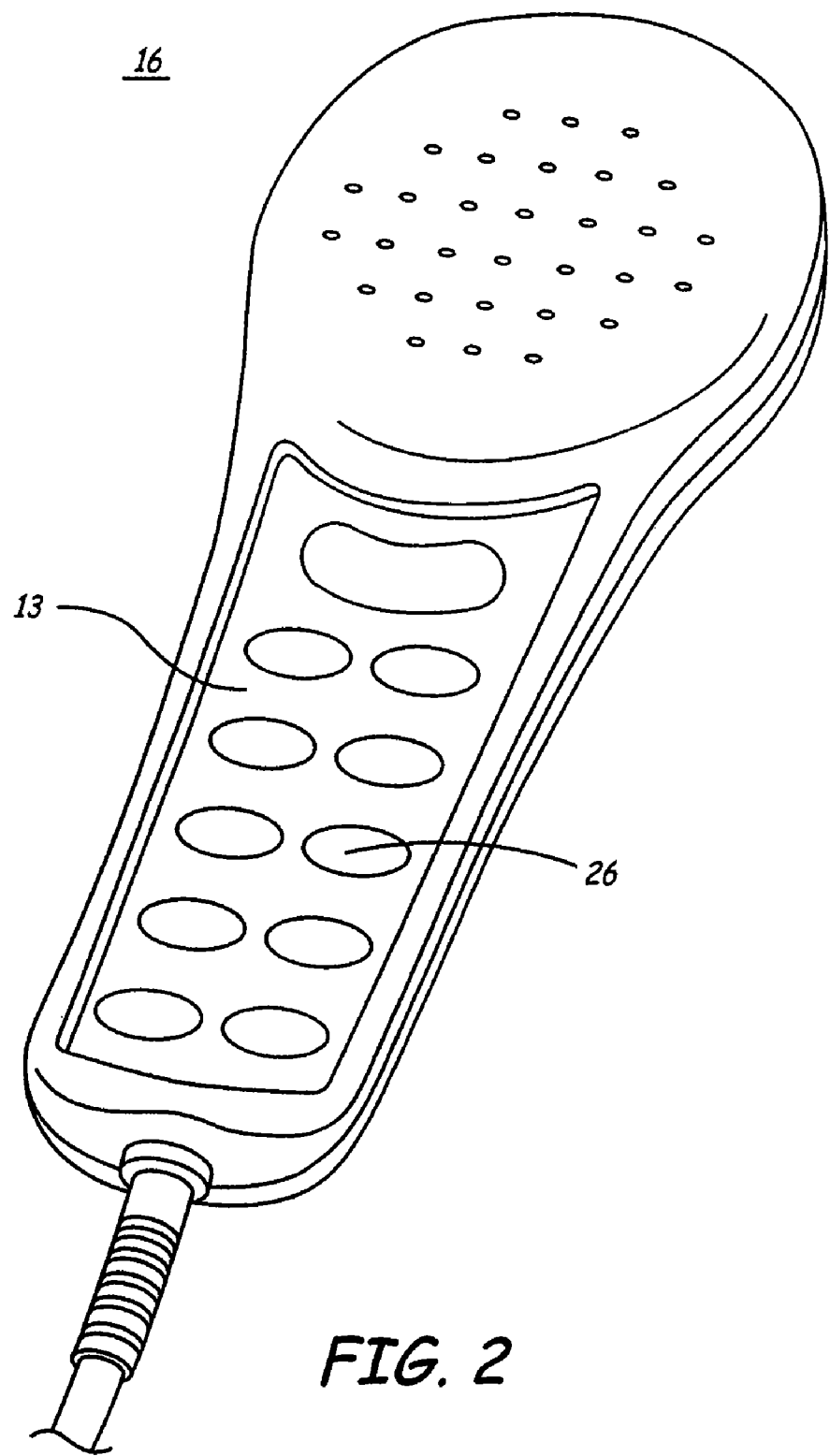
FIG. 2 is a perspective view of a pillow speaker, according to one embodiment of the present invention.

FIG. 2 is a pillow speaker 16 according to one aspect of the present invention. The pillow speaker 16 is hermetically sealed to prevent exposure to atmospheric contaminants. That is, none of the components of the pillow speaker 16 are exposed to atmospheric contaminants. The hermetically sealed pillow speaker 16 allows functions to be inputted via membrane switches 26 without the need for an exposed, mechanically actuated control. Each membrane switch 26 has a membrane covering the switch that seals the switch from atmospheric contaminants and the switch 26 can be actuated through the membrane. Thus, the membrane switches 26 provide a significant advantage over mechanical controls, because the mechanical controls require invasive openings into the pillow speaker that allow entrance of atmospheric contaminants, while no such opening is required for the membrane switches 26. As an example, one approach to sealing a pillow speaker from contaminants is described in U.S. patent application Ser. No. 09/609,503, filed Jul. 3, 2000, entitled "Hermetically Sealed Communication Device," which is hereby incorporated by reference in its entirety.

Figure 3:
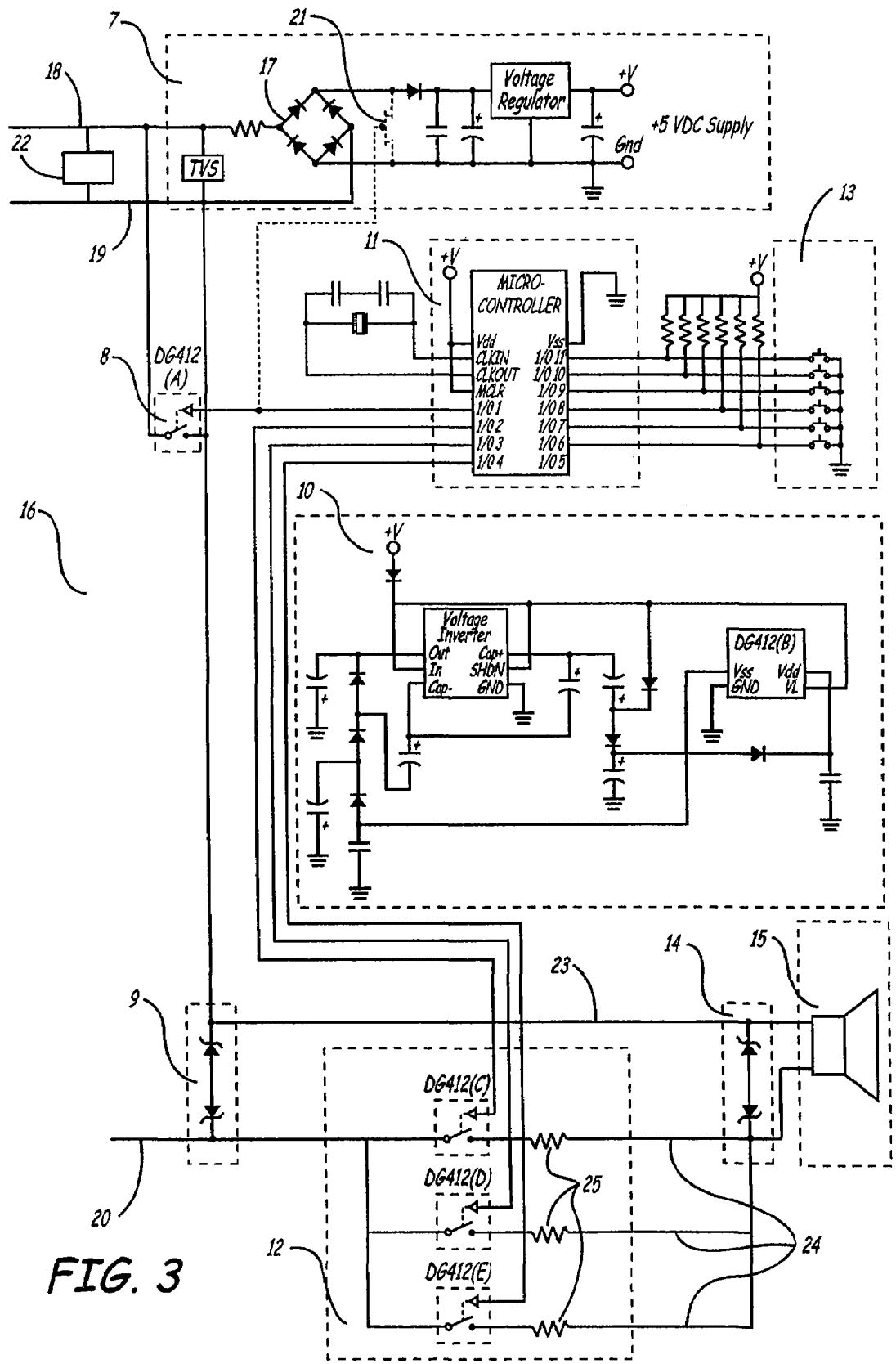
FIG. 3 is a circuit diagram of a television control system, according to one embodiment of the present invention.

FIG. 3 is a circuit diagram of a pillow speaker 16. The pillow speaker 16 of one embodiment has a power supply 7 that accommodates either polarity of the incoming direct current ("DC"), outputting a polarity compatible with the pillow speaker 16. The pillow speaker 16 can also include a user interface 13 for user input and a microprocessor 11 for processing information and generating encoded signals. According to another aspect of the invention, the pillow speaker has a power booster 10 to increase voltage levels and a bilateral electronic switch 8 to accommodate any polarity differential in the incoming electrical current. Audio signals from the television 1 are converted into sound by the internal speaker 15 through the use of the analog switches 12 in the pillow speaker 16.

The pillow speaker 16 in one embodiment derives its power solely from the television 1. The DC voltage polarity from the integrated television 1 can vary according to the type or brand of television 1. Some televisions may have a negative voltage output, while others may have a positive voltage output. The power supply 7 addresses the polarity variability. Regardless of the polarity of the voltage output from the television 1, the power supply 7 outputs voltage to the pillow speaker 16 of the polarity appropriate to power the pillow speaker 16. The power from the television 1 is transferred to the power supply 7 via the DATA line 18 and COM line 19.

To provide a power output having a particular polarity, regardless of the polarity of the incoming supply, the power supply 7 includes a diode bridge 17. The DC voltage supplied from the television 1 may have either polarity and the power supply 7 produces a power supply of, for example, +5 voltage DC. In one embodiment, the materials and components used in the power supply 7 minimize the amount of power loss during the polarity correcting process. The present invention further encompasses any other component or components known to convert or pass an incoming DC current to a compatible polarity for an electronic device.

A user operates the television 1 by transmitting encoded signals to the television 1 via the pillow speaker 16. According to one aspect of the invention, the pillow speaker 16 allows user input through a user interface 13. When a membrane switch 26 on the user interface 13 is pressed, a circuit is closed, causing a low power microcontroller or microprocessor 11 to generate the appropriate encoded signal that corresponds to the function desired and is compatible with the type or brand of television 1 to which it is connected. The appropriate encoded signal is subsequently transmitted to the television 1. The microprocessor 11 can be any such microcontroller or microprocessor generally used in electronic devices. For example, the microprocessor 11 could be a PIC16C505 manufactured by Microchip.

According to one aspect of the present invention, the pillow speaker 16, as a result of programming, supplies only the data codes required for the specific television 1 being used with the pillow speaker 16. Alternatively, the pillow speaker 16 supplies a plurality of different codes required for a plurality of different televisions regardless of what the pillow speaker 16 is actually connected to.

In one embodiment, the pillow speaker 16 may be capable of supplying data codes appropriate for the television 1 connected to the pillow speaker 16. To provide only the necessary data codes, the pillow speaker 16 may have a circuit or memory capable of storing various tables of code sets; one for each of the televisions available for use. By simply inputting information into the pillow speaker 16 prior to use, the pillow speaker 16 can be programmed to generate the code set appropriate for the desired television 1. The information can be inputted into the pillow speaker 16 via the user interface 13. Alternatively, the information is inputted into the pillow speaker 16 through a setup routine, via either hardwire switching or software, that allows the pillow speaker 16 to be programmed to generate any of the code sets in memory.

The programming related to the television-specific code sets can be stored in non-volatile memory so that the code set compatible with the television 1 is retained even after periods in which no power is provided to the pillow speaker 16. This allows the pillow speaker 16 to be unplugged and reconnected at a later time with no loss of programming. For example, the data codes and setup routines may be stored in non-volatile memory in the microprocessor 11. The current mode setting can be stored in the microprocessor 11 in non-volatile random access memory ("NVRAM") or, alternatively, external to the microprocessor 11. Once the programming has been completed, when a membrane switch 26 on the user interface 13 is pressed, the microprocessor 11 first reads the NVRAM to determine the appropriate mode setting or encoded signal, then transmits that signal to the television 1.

In one aspect of the invention, the mode setting can also be changed via the user interface 13. When the appropriate membrane switches 26 on the user interface 13 are pressed, the microprocessor 11 writes a new mode setting into the NVRAM.

Alternatively, the pillow speaker 16 identifies the type or brand of television 1 connected to the pillow speaker 16 and sends only the control code specific to the television 1 in use. A sensor circuit 22 in the pillow speaker 16 may electronically sense the voltage and polarity of the DATA wire 18 with reference to the COM wire 19 and provide the information to the microprocessor 11. As each brand of television is unique in this regard, the information is sufficient to identify the television 1. The sensor circuit 22 may be placed across the DATA wire 18 and the COM wire 19. The microprocessor 11 uses the information to identify the brand or type of television 1 in use and sends only the data codes for the specific television 1. If unconventional wiring is present in the television control system, the programming can be manually reconfigured or overriden in order to send the appropriate control code. The identification of the television 1 can be accomplished using voltage divider, reference, and comparator circuitry. Further, any other commonly-known methods of sensing voltage levels and polarity may be used.

In one embodiment, the DATA wire 18 and COM wire 19, i.e., the same pair of wires that receive power from the television 1, are used as a serial data bus across which the encoded signal is sent to the television 1 from the pillow speaker 16. As discussed above, the DC voltage polarity created by the television 1 across the DATA wire 18 and COM wire 19 varies according to the type or brand of television 1. Given this variable voltage polarity across the data bus, any device used to transmit information via the DATA wire 18 and COM wire 19 must be polarity neutral. A bilateral electronic switch 8 is placed across the data bus to make compatible or accommodate any polarity. Alternatively, the bilateral switch 8 can be integrated into the power supply 7. For example, a switch such as a field effect transistor (FET) 21 can be placed between the diode bridge 17 and the other components of the power supply 7 as an alternative to the analog switch 8.

The bilateral electronic switch 8 may be a low power analog switch. For example, the bilateral electronic switch 8 could be could be chosen from switches designated DG418 or DG412, both of which are manufactured by Maxim. Other commonly known switches could also be used. Alternatively, the voltage polarity can be made compatible with a transistor or other similar solid state device that is isolated with diodes from the polarity fluctuations and power supply circuit.

The pillow speaker 16 may also have a power booster 10 that is capable of providing increased voltage. As discussed above, the amount of power available from a television 1 varies by brand and can extend, for example, as high as 12 volts DC. To properly operate the bilateral switch 8 and thus have the capability of sending an encoded signal to the television 1, the pillow speaker 16 must have a voltage source capable of exceeding this DC bias. That is, the pillow speaker 16 requires an internal component capable of supplying voltage greater than the DC bias created by the television 1 in use. The power booster 10 of the pillow speaker 16 in one embodiment is a capacitor charge pump 10. The capacitor charge pump 10 is a positive and negative source that boosts the power supply of the pillow speaker 16 beyond any DC bias created by any television 1. That is, the capacitor charge pump 10 can generate either positive or negative voltage depending on the type of television 1. The capacitor charge pump 10 can be any such charge pump commonly known, such as the Maxim MAX1720.

Alternatively, the power booster 10 can also be a voltage multiplier circuit. Each multiplier circuit can be a diode and capacitor network. The voltage multiplier circuit can increase the voltage for example as much as four times the amount provided by the power supply 7 or more. For example, the voltage multiplier circuit in one aspect of the invention is a doubler circuit. In other embodiments, the multiplier circuit is a triple or quadruple circuit. The power booster 10 encompasses any commonly known voltage multiplier circuit. In a further aspect of the invention, the power booster 10 has both a capacitor charge pump and a voltage multiplier circuit.

The television 1 transmits an audio signal to the pillow speaker 16 over the AUDIO line 20. An internal speaker 15, using power generated by the power booster 10, converts the signal into sound. The volume of the sound coming from the internal speaker 15 is controlled along an electronic volume control circuit 23.

In one embodiment, the volume control circuit 23 comprises multi-legged audio channels in series with the AUDIO line 20 and the internal speaker 15. The volume of the sound coming from the internal speaker 15 is controlled by the multi-legged audio channels 24. Each leg or pathway 24 is selectable, either alone or in conjunction with one or more of the other legs, and each is designed with a pre-determined in-line resistance, the result of which is the application of various levels of attenuation to the audio signal.

The multi-legged audio channels 24, in one aspect of the invention, comprise a series of analog switches 12 and resistors 25. In operation, audio coming from the television 20 is applied to the series of analog switches 12. The volume of the sound produced by the pillow speaker 16 is controlled by user input at the user interface 13. The input is fed as an electronic signal to the microprocessor 11, which generates an appropriate signal to be transmitted to the analog switches 12. Alternatively, the electronic signal can be transmitted from the microprocessor 11 to a binary counter circuit (not shown), which in turn can provide a binary word as an input to the analog switches 12.

The binary switches 12 can be controlled by the signal from the microprocessor 11. Depending on the signal, none, one, all, or some of the binary switches 12 will close. Thus, depending on the signal, the incoming audio will be routed along the multi-legged audio channels 24 over none, one, all, or some of the resistors 25 on the output channels 24. The resistors 25 on each output channel 24 provide a predetermined in-line resistance that may vary across resistors 25, and the outputs of all of the output channels 24 are coupled together to form the controlled audio feed to the speaker 15. The degree of audio energy allowed to reach the speaker 15 is dependent upon which channels 24 are enabled and the resulting cumulative attenuation in the circuit 23.

The binary switches 12 in one embodiment are operated with power supplied by the power booster 10. To function, the binary switches 12 require a power source capable of producing enough voltage to stay within a voltage range having a minimum and maximum level. For example, the minimum level of voltage can be as large as 15 volts. The power booster 10 provides the appropriate level of voltage.

In another aspect of the invention, the voltage level can be controlled with the assistance of an electronic input clamp 9. The electronic clamp 9 can be placed on the volume control circuit 23. The electronic input clamp 9 ensures that the incoming audio level remains within the minimum and maximum voltage levels of the DC voltage supply. The electronic input clamp 9 can be any commonly-known clamp. For example, the clamp 9 can be a series Zener diode.

In a further embodiment, an electronic output clamp 14 similar to the input clamp 9 is placed on the volume control circuit 23 near the speaker 15. The electronic output clamp 14 can ensure that the outgoing audio level remains within the minimum and maximum voltage levels.

Although the present invention has been described with reference to preferred embodiments, persons skilled in the art will recognize that changes may be made in form and detail without departing from the spirit and scope of the invention.

What is claimed is:

1. An apparatus for controlling a television comprising:
   a housing electrically coupled to the television, wherein the television is a source of electrical power for the apparatus;
   a power supply disposed within the housing, the power supply being configured to derive power for the apparatus from the electrical power from the television wherein the power supply can receive any polarity of the electrical power from the television and outputs an appropriate polarity of the electrical power to the apparatus; and
   a microprocessor powered by the power supply, the microprocessor configured to transmit encoded signals to the television.

2. The apparatus of claim 1 wherein the television is a sole source of electrical power for the apparatus.

3. The apparatus of claim 1 wherein the microprocessor is configured to transmit a plurality of the encoded signals to the television.

4. The apparatus of claim 1 wherein the microprocessor is configured to transmit only compatible encoded signals to the television.

5. The apparatus of claim 4 wherein the microprocessor has a hardware configuration allowing a user to transmit only compatible encoded signals to the television.

6. The apparatus of claim 4 wherein the microprocessor is configured to be programmed by a user to transmit only compatible encoded signals to the television.

7. The apparatus of claim 6 wherein the microprocessor is configured to be programmed by user input at a user interface to transmit only compatible encoded signals to the television.

8. The apparatus of claim 1 further comprising at least one membrane switch on a user interface disposed within the housing, the membrane switch being sealed from atmospheric contaminants.

9. An apparatus for controlling a television comprising:
   a housing electrically coupled to the television, wherein the television is a source of electrical power for the apparatus;
   a microprocessor disposed within the housing, the microprocessor configured to transmit encoded signals to the television; and
   a bilateral switch operably connected to the microprocessor, the bilateral switch configured to allow the microprocessor to transmit encoded signals to the television by making compatible any voltage polarity of the electrical power from the television.

10. An apparatus for controlling a television comprising:
    a housing electrically coupled to the television, wherein the television is a source of electrical power for the apparatus;
    a power supply disposed within the housing, the power supply being configured to derive the power for the apparatus from the electrical power from the television, wherein the power supply can receive any polarity of the electrical power from the television and outputs an appropriate polarity of the electrical power to the apparatus;
    a microprocessor powered by the power supply and configured to transmit encoded signals to the television;
    a bilateral switch operably connected to the microprocessor, the bilateral switch configured to allow the microprocessor to transmit encoded signals to the television by making compatible any voltage polarity of the electrical power from the television;
    a sensor circuit disposed within the housing, the sensor circuit configured to sense information generated by the television and transmit the information to the microprocessor, wherein the microprocessor is configured to receive the information from the sensor circuit, identify the television based on the information, and transmit only compatible encoded signals to the television; and
    a volume control circuit operably connected to a user interface disposed within the housing, the volume control circuit having a plurality of audio output channels wherein the channels are configured to be selectively enabled by the signals from the user interface.

11. The apparatus of claim 10 wherein the television is a sole source of electrical power for the apparatus.

12. The apparatus of claim 10 wherein the information is voltage information.

13. The apparatus of claim 10 wherein the information is polarity information.

14. The apparatus of claim 10 wherein the information is voltage information and polarity information.

15. The apparatus of claim 10 further comprising at least one membrane switch on the user interface, the membrane switch being sealed from atmospheric contaminants.

16. A communication system comprising:

a central station;

a nurse call system connected to the central station, the nurse call system configured to send signals to the central station and receive signals from the central station;

a remote apparatus connected to the central station wherein the remote apparatus is configured to receive signals from the nurse call system through the central station, the remote apparatus comprising:

a power supply disposed within the remote apparatus, the power supply being configured to derive power for the remote apparatus from incoming electrical power, wherein the power supply can receive any polarity of the electrical power from a television and outputs an appropriate polarity of the electrical power to the apparatus; and a microprocessor powered by the power supply, the microprocessor configured to transmit encoded signals to the central station; and the television connected to the central station, whereby the television is a source of power to the remote apparatus, wherein the television receives the encoded signals from the remote apparatus through the nurse call system.

17. An apparatus for controlling a television comprising:

a pillow speaker electrically coupled to the television, wherein the television is a source of electrical power for the pillow speaker;

a power supply disposed within the pillow speaker, the power supply being configured to derive power for the apparatus from the electrical power from the television, wherein the power supply can receive any polarity of the electrical power from the television and outputs an appropriate polarity of the electrical power to the apparatus;

a microprocessor powered by the power supply, the microprocessor configured to transmit encoded signals to the television;

a user interface disposed within the pillow speaker, the user interface configured to provide signals to the microprocessor based on user input;

a plurality of membrane switches disposed on the user interface, the plurality of membrane switches configured to produce the signals provided to the microprocessor;

a bilateral switch operably connected to the microprocessor, the bilateral switch configured to allow the microprocessor to transmit encoded signals to the television by making compatible any voltage polarity of the electrical power from the television;

a sensor circuit disposed within the pillow speaker, the sensor circuit configured to sense information generated by the television and transmit the information to the microprocessor, wherein the microprocessor is configured to receive the information from the sensor circuit, identify the television based on the information, and transmit only compatible encoded signals to the television; and a volume control circuit operably connected to the user interface, the volume control circuit having a plurality of audio output channels wherein the channels are configured to be selectively enabled by signals from the user interface.

\* \* \* \* \*